(12) United States Patent
Takano et al.

(10) Patent No.: US 6,376,907 B1
(45) Date of Patent: Apr. 23, 2002

(54) BALL GRID ARRAY TYPE PACKAGE FOR SEMICONDUCTOR DEVICE

(75) Inventors: Eiji Takano, Yokohama; Eiichi Hosomi, Kanagawa; Chiaki Takubo, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/201,866

(22) Filed: Nov. 30, 1998

(30) Foreign Application Priority Data

Dec. 1, 1997 (JP) .............................................. 9-330210

(51) Int. Cl.⁷ .............................................. H01L 23/12
(52) U.S. Cl. ........................ 257/704; 257/707; 257/706; 257/778; 257/710; 257/720; 257/712; 257/713; 257/719; 257/779; 257/780; 257/758
(58) Field of Search ................................ 257/704, 707, 257/706, 710, 720, 712, 713, 719, 778, 779, 780, 758; 438/108; 174/52.4

(56) References Cited

U.S. PATENT DOCUMENTS

| | | | | |
|---|---|---|---|---|
| 4,147,889 A | * | 4/1979 | Andrews et al. | 174/52 FP |
| 4,742,024 A | * | 5/1988 | Sugimoto et al. | 437/211 |
| 5,107,329 A | * | 4/1992 | Okinaga et al. | 357/74 |
| 5,381,039 A | * | 1/1995 | Morrison | 257/701 |
| 5,623,394 A | * | 4/1997 | Sherif et al. | 361/705 |
| 5,909,056 A | * | 6/1999 | Mertol | 257/704 |
| 5,931,222 A | * | 8/1999 | Toy et al. | 165/80.3 |
| 5,990,418 A | * | 11/1999 | Bivona et al. | 174/52.4 |
| 6,008,536 A | * | 12/1999 | Mertol | 257/704 |

FOREIGN PATENT DOCUMENTS

| | | | |
|---|---|---|---|
| JP | 403034445 A | * | 1/1991 |
| JP | 03187247 A | | 8/1991 |
| JP | 403187247 A | * | 8/1991 |
| JP | 07169869 A | | 7/1995 |
| JP | 411087410 A | * | 3/1999 |

* cited by examiner

*Primary Examiner*—Minh Loan Tran
*Assistant Examiner*—Luan Thai
(74) *Attorney, Agent, or Firm*—Finnegan, Henderson, Farabow, Garrett & Dunner, L.L.P.

(57) ABSTRACT

A semiconductor device with a BGA package includes a substrate made of a resin and having one side on which a number of solder ball terminals are formed and the other side on which a chip mounting portion electrically connected to the solder ball terminals is formed, and a cover plate made of a metal and attached to a semiconductor chip so as to cover and come into contact with it under a condition where the semiconductor chip is connected to the resin substrate by a flip-chip process. The cover plate includes a base brought into contact with the semiconductor chip and a peripheral portion formed with a plurality of bonding portions where the cover plate is bonded to the substrate. The bonding portions are discontinuous to each other.

26 Claims, 12 Drawing Sheets

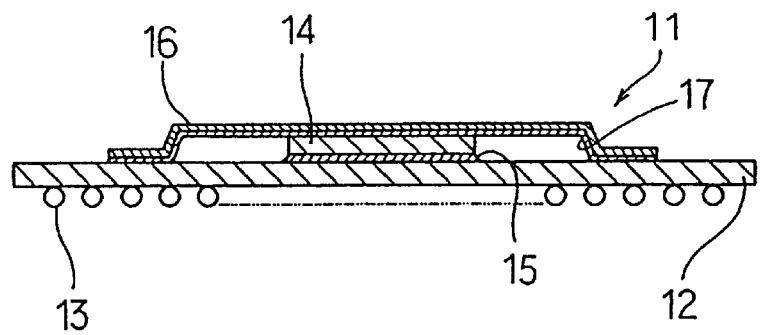
F I G. 1 A
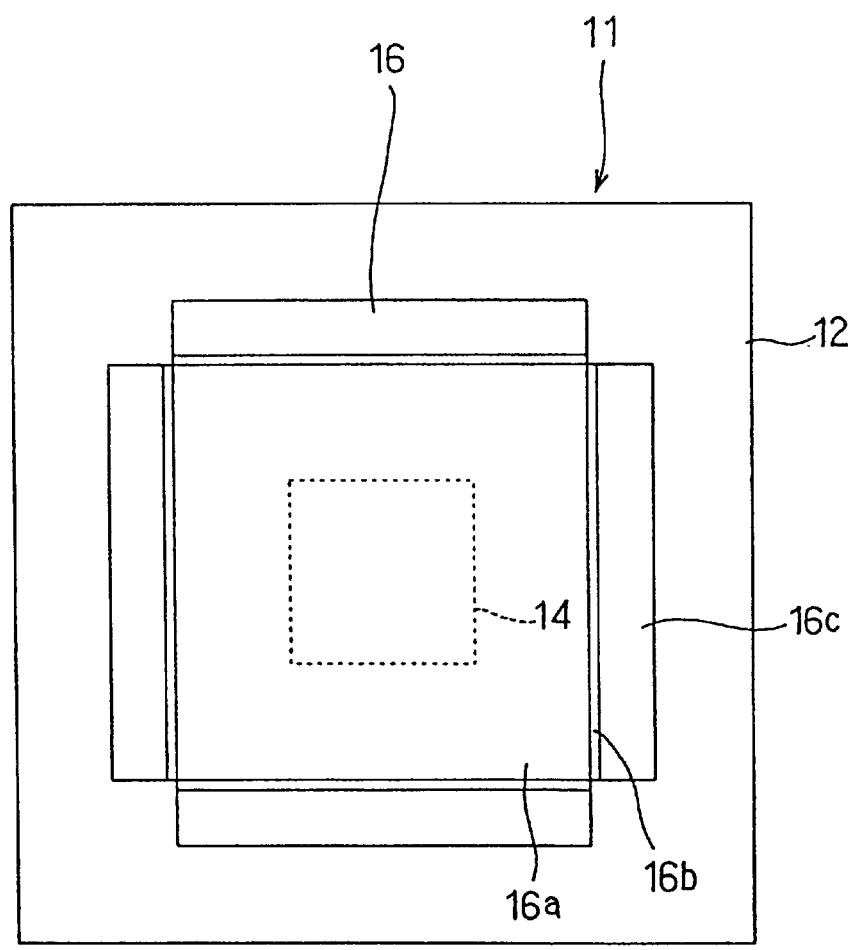
F I G. 1 B

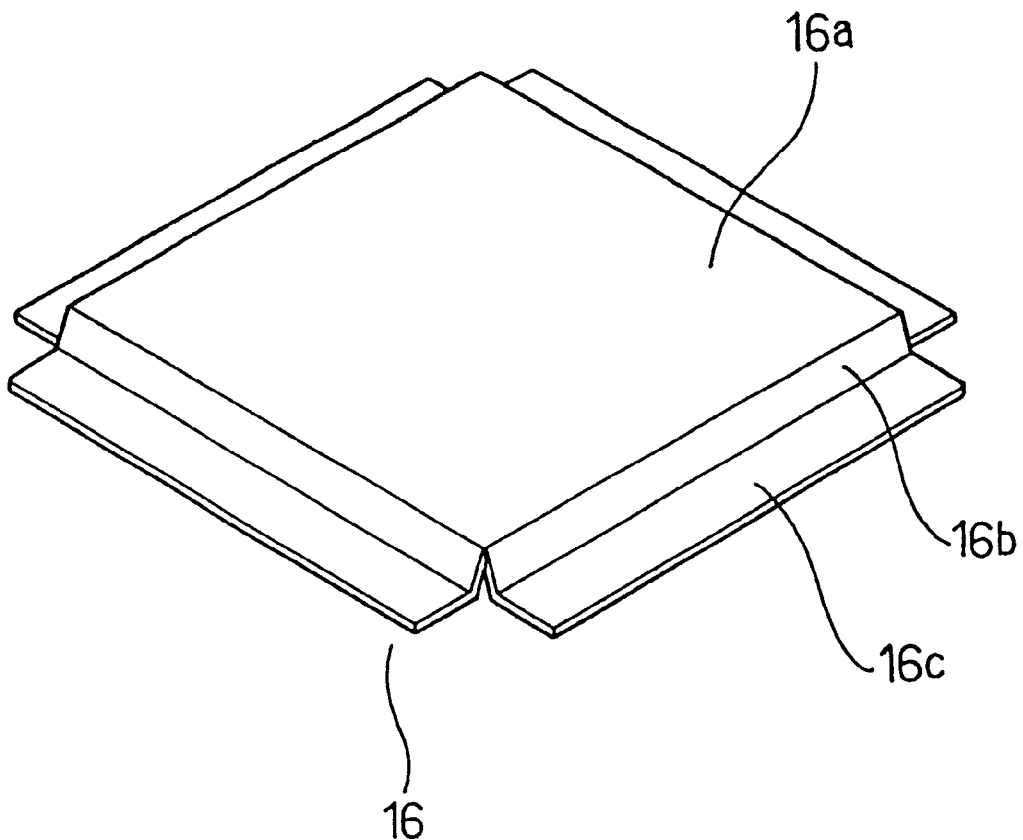
F I G. 2

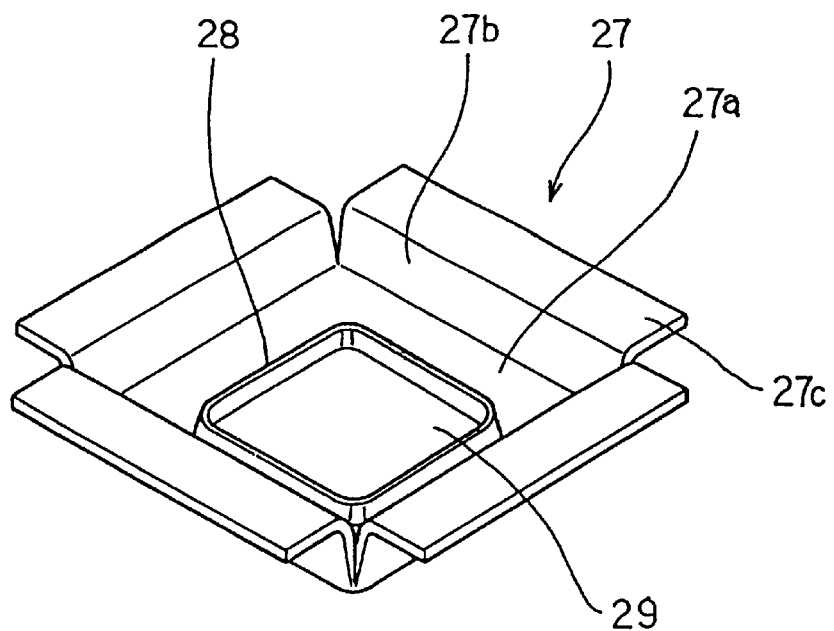
F I G. 8
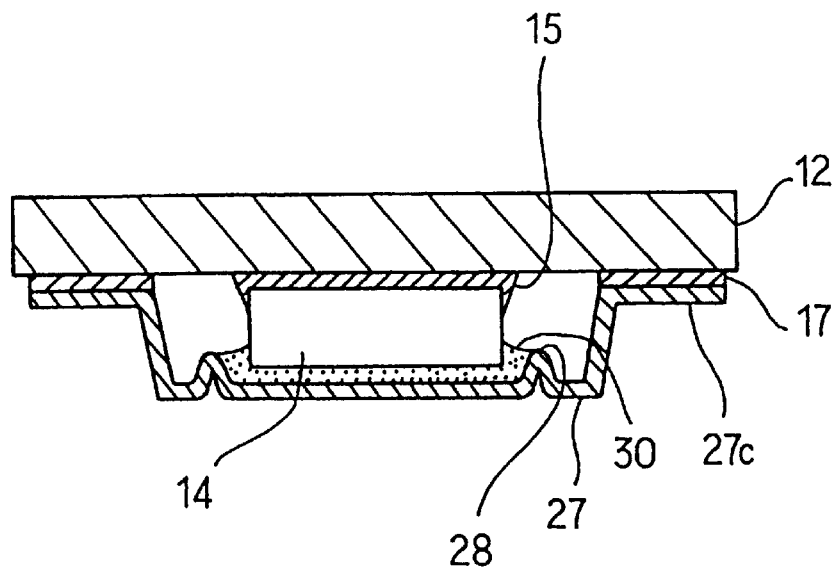
F I G. 9

BALL GRID ARRAY TYPE PACKAGE FOR SEMICONDUCTOR DEVICE

BACKGROUND OF THE INVENTION

1. Field of the Invention

This invention relates to a semiconductor device provided with a package of the ball grid array (BGA) type and comprising semiconductor chips connected by a flip-chip process to a resin substrate with a number of solder ball terminals.

2. Description of the Prior Art

Packages for packaging semiconductor chips have recently been provided with an increasing number of base pins (lead wires). As one of such packages, there has been provided a package of the pin grid array (PGA) type in which pins are disposed into the shape of a grid on the overall backside of the package. In the PGA type package, a ceramic substrate is provided with a number of base pins embedded therein and includes a mounting portion on which a number of electrode pads are provided. The pins are connected via conductor patterns to the electrode pads respectively. A semiconductor chip is mounted onto the mounting portion of the substrate by a flip-chip process.

In mounting the semiconductor chip by the flip-chip process, it is important to be able to dissipate or radiate heat produced by the mounted chip not only from a mounted side thereof but also from its backside opposite the mounted side. For this purpose, a container-shaped cover plate is made of a metal such as aluminum, for example. The cover plate is bonded to an upper side of the semiconductor chip and further at a periphery thereof to the substrate. Heat produced by the semiconductor chip is transferred from the backside or upper side thereof via an adhesive agent to the cover plate, from which the heat is radiated outward. The cover plate serves to mechanically and electrically protect the semiconductor chip as well as to radiate heat therefrom.

Various packages of the ball grid array (BGA) type have recently been developed instead of the above-described PGA type packages. The BGA type packages have recently drawn attention as those of the surface mounting type. In the BGA type packages, a number of ball-shaped solder terminals (solder balls) are provided on connecting terminal conductors disposed into the shape of a grid, instead of the pins. The solder balls are disposed opposite the connecting terminal conductors respectively when the BGA type package is mounted on the printed board. The solder balls are soldered in the block by reflow processing to be electrically connected to the respective conductors.

The soldered terminals are sometimes subjected to mechanical stress in the BGA type package since the BGA type package is mounted on the substrate without using terminals so as to be closely adherent to the substrate. The package needs to be rendered large in size with increase in the size of the semiconductor chip. However, when a large-sized ceramic substrate is mounted on the printed board, mechanical stress due to changes in the temperatures of the substrate and the board is increased to such an extent that the stress cannot be ignored. The solder terminals located particularly at ends of the package are subjected to a larger stress than those located at the center of the package. This sometimes results in occurrence of cracks in connecting portions of the solder or in disconnection or circuit opening.

The above-described drawbacks result from the difference in coefficients of linear expansion between the printed board and the ceramic. To overcome the drawbacks, the prior art has proposed use of a resin substrate as the substrate of the package on which the semiconductor chip is mounted. By the use of the resin substrate, the mechanical stress to which the connecting portions of the solder is subjected can be eased or reduced. Furthermore, the size of the substrate of the package can be increased, so that the limitation in the size of the semiconductor chip can be reduced.

However, stress between the resin substrate and the radiating cover plate sometimes warps the substrate when the cover plate is attached to the resin substrate. Particularly when the cover plate is made of a metal such as aluminum, the stress deforms the resin substrate while the bonded cover plate is being cooled. This stress adversely affects the semiconductor chip, resulting in a new drawback.

It is important to maintain a desirable heat conductivity between the cover plate and the semiconductor chip so that heat generated by the semiconductor chip is efficiently radiated through the cover plate. Accordingly, the heat conductivity of the cover plate needs to be taken into consideration. In view of this, a process as shown in FIGS. 14 and 15 is employed, for example. Prior to a step of attaching a cover plate 1 to a resin substrate 2, a predetermined amount of paste 3 with high heat conductivity is applied to an inside of the cover plate 1 by a dispenser 4 (see FIG. 14). In this state, the cover plate 1 is bonded by an adhesive agent 7 to the resin substrate 2 on which the semiconductor chip 5 has been mounted (see FIG. 15). The inside portion of the cover plate 1 to which the paste 3 is applied is maintained in contact with the semiconductor chip 5.

The step of applying the paste 3 to the cover plate 1 is an independent step in an ordinary assembly line since only the cover plate is processed in the step. Furthermore, this step requires new equipment depending upon conditions such as the shape and size of the cover plate 1, resulting in an increase in the cost.

Furthermore, when having a low viscosity, the paste 3 overflows a predetermined applying area on the inside of the cover plate 1, so that it becomes difficult to suitably apply a necessary amount of paste 3 to the cover plate.

SUMMARY OF THE INVENTION

Therefore, an object of the present invention is to provide a semiconductor device provided with the BGA type package including a cover plate wherein the above-described drawbacks due to warp of the substrate can be prevented.

Another object of the invention is to provide a semiconductor device provided with the BGA type package wherein a high-temperature conductive paste can, even if it has a low viscosity, be applied to the cover plate without overflowing and can readily be applied by the conventional equipment with no specific equipment being required.

The present invention provides a semiconductor device comprising a substrate made of a resin and having one side on which a number of solder ball terminals are provided and the other side on which a chip mounting portion electrically connected to the solder ball terminals is provided, and a cover plate made of a metal and attached to a semiconductor chip so as to cover and come into contact with the same under a condition where the semiconductor chip is connected to the resin substrate by a flip-chip process, the cover plate including a base brought into contact with the semiconductor chip and a peripheral portion provided with a plurality of bonding portions where the cover plate is bonded to the substrate, the bonding portions being discontinuous to each other.

According to the above-described construction, the cover plate includes a plurality of the peripheral discontinuous bonding portions where the cover plate is bonded to the substrate to which the semiconductor chip is connected. Stress due to temperature changes occurs between the substrate and the cover plate when the cover plate is bonded to the substrate. However, the above-described construction can reduce the stress as compared with the conventional construction in which the cover plate has a continuous bonding portion. Consequently, the warp of the substrate due to the bonding of the cover plate thereto can be reduced even when the substrate is made of a resin. Furthermore, even when a large-sized substrate is used, the structure of the semiconductor device can be rendered practically durable.

In one preferred form, the bonding portions are arranged into an axial symmetry. Consequently, since the stress is evenly shared by the bonding portions, the stress can efficiently be dispersed.

In another preferred form, the cover plate includes at least one connecting portion connecting between the base and the bonding portions and is formed by bending a metal plate so that the base, and the bonding portions are connected by the connecting portion such that the base, bonding portions and connecting portion are formed integrally with one another. Consequently, the number of parts can be reduced since the cover plate is obtained from a single metal plate. Furthermore, the connecting portion is preferably divided into a plurality of portions connecting the respective connecting portions to the base. Consequently, the stress can be reduced as compared with the case where the cover plate with a continuous bonding portion is formed of a single metal plate by drawing, whereupon the warp of the substrate can be reduced.

In further another preferred form, each divided portion of the connecting portion has a width smaller than a length of the corresponding bonding portion. In this construction, the stress produced in the base is absorbed by the connecting portions, so that the stress produced between the cover plate and the resin substrate can be eased and accordingly, the warp of the substrate can be reduced.

In the above-described construction, an amount of heat transferred through the connecting portions is decreased since the connecting portions include reduced width portions respectively. Accordingly, the construction should be employed when the reduction in the stress has priority over the heat radiation.

In further another preferred form, the connecting portion is formed continuously so as to surround the base. The base and the connecting portion serving to cover the semiconductor chip are formed into the shape of a container. Consequently, this construction is effective in the protection of the semiconductor chip in addition to provision of the reduction in the stress.

In further another preferred form, the cover plate is made of a metal having a linear expansion coefficient equal to or larger than one of the resin substrate and equal to or smaller than 20 ppm/° C. When the cover plate bonded to the resin substrate is made of a metal with the above-described range of the linear expansion coefficient, the warp of the substrate can effectively reduced.

The cover plate is preferably made of copper (Cu) or stainless steel. Either metal meets the above-mentioned range of the linear expansion coefficient (Cu: 17.6 ppm/° C.; and SUS: 17.3 ppm/° C.). Since each metal has a good heat conductivity, the heat radiating effect can be improved.

Each bonding portion preferably has such a minimum width that a predetermined bonding strength is ensured between the resin substrate and each bonding portion. When the reduction in the warp is taken into consideration, the width of each bonding portion should be rendered smaller. However, a predetermined bonding strength needs to be ensured in each connecting portion. Accordingly, it is effective to render the width of each connecting portion smaller so far as the predetermined bonding strength is ensured.

Each bonding portion of the cover plate preferably has a width ranging between 2 mm and 4 mm. Consequently, the warp of the substrate can desirably be reduced even when the resin substrate 40 mm square is used.

The invention also provides a semiconductor device comprising a substrate made of a resin and having one side on which a number of solder ball terminals are provided and the other side on which a chip mounting portion electrically connected to the solder ball terminals is provided, and a cover plate made of a metal and attached to a semiconductor chip so as to cover and come into contact with the same, the semiconductor chip being connected to the resin substrate by a flip-chip process, the cover plate including a base brought into contact with the semiconductor chip and a peripheral portion provided with a plurality of bonding portions where the cover plate is bonded to the substrate, the bonding portions being discontinuous to each other, the cover plate including a barrier preventing a paste for increasing heat conductivity from overflowing a portion thereof corresponding to a location of the semiconductor chip the paste being provided between the semiconductor chip and the cover plate when the chip is mounted on the substrate.

According to the above-described construction, even when the paste applied to the cover plate for improvement in the heat conductivity has a low viscosity, the barrier accommodates the predetermined amount of paste therein, retaining the paste while the cover plate is bonded to the substrate. Consequently, a necessary amount of paste can be used effectively and steadily, and the paste can be prevented from flowing outside the barrier. The barrier is preferably formed integrally with the cover plate. Alternatively, an adhesive sheet is preferably applied to substantially the overall face except a portion thereof brought into contact with the semiconductor chip, whereby the barrier is formed.

The invention further provides a semiconductor device comprising a substrate made of a resin and having one side on which a number of solder ball terminals are provided and the other side on which a chip mounting portion electrically connected to the solder ball terminals is provided, and a cover plate made of a metal and attached to a semiconductor chip so as to cover and come into contact with the same. The semiconductor chip is connected to the resin substrate by a flip-chip process. The cover plate includes a base brought into contact with the semiconductor chip and a peripheral portion provided with a plurality of bonding portions where the cover plate is bonded to the substrate. The bonding portions are discontinuous to each other. The cover plate has an injection opening through which a paste for improvement in heat conductivity is supplied into an area of a space defined between the cover plate and the resin substrate when the cover plate is attached to the resin substrate. The area corresponds to a location of the semiconductor chip.

According to the above-described construction, the paste for improvement in the heat conductivity can be supplied through the injection opening after the cover plate has been bonded to the resin substrate. This eliminates equipment for applying the paste to the cover plate previously. Consequently, the semiconductor device can be fabricated with use of no special assembling equipment.

BRIEF DESCRIPTION OF THE DRAWINGS

Other objects, features and advantages of the present invention will become clear upon reviewing the following description of the preferred embodiments, made with reference to the accompanying drawings, in which:

FIGS. 1A and 1B are schematic longitudinal side section and top plan view of the BGA package of a first embodiment in accordance with the present invention respectively;

FIG. 2 is a perspective view of the cover plate;

FIG. 8 is a perspective view of the cover plate used in the BGA package of a second embodiment in accordance with the invention, showing the inside of the cover plate;

FIG. 9 is a view similar to FIG. 1A;

DETAILED DESCRIPTION OF THE PREFERRED EMBODIMENTS

Figure 3:
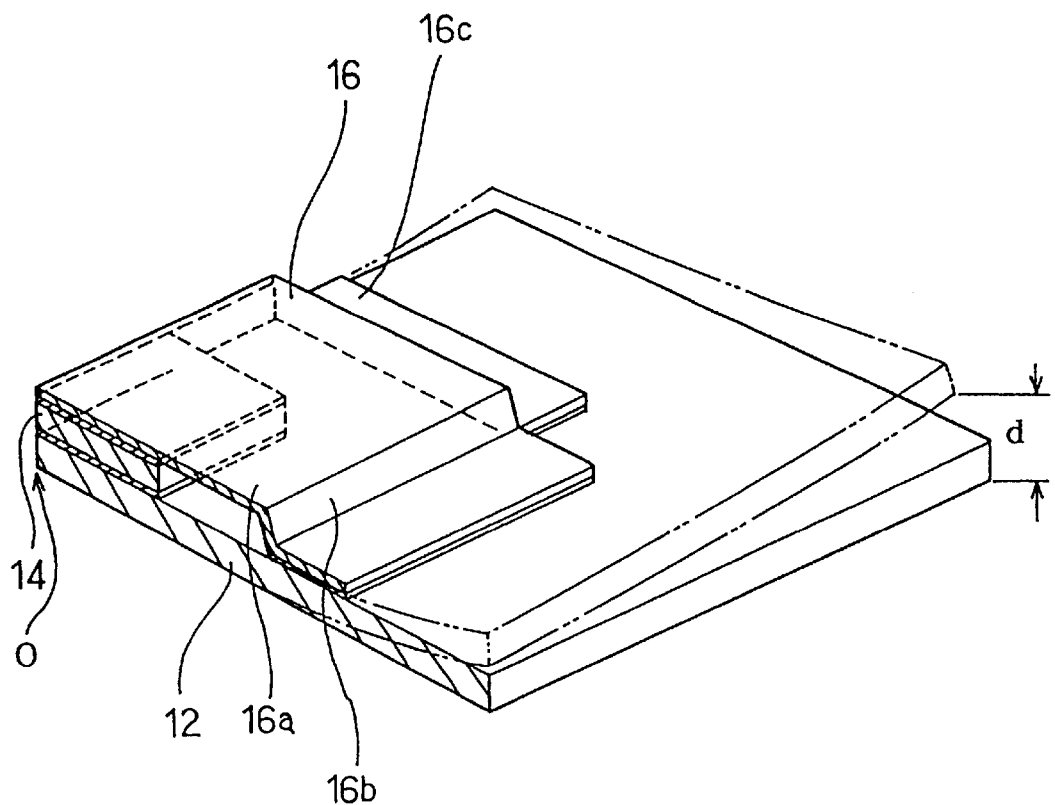
FIG. 3 is a perspective view of a quarter simulation model of the package.
Figure 4A:
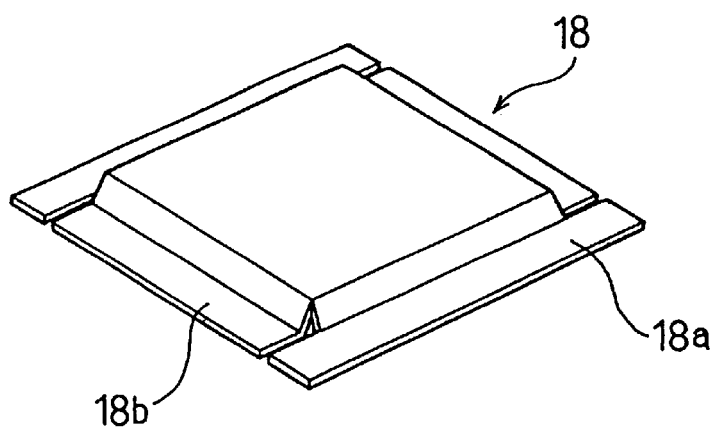
FIGS. 4A to 4C are perspective views of modified cover plates respectively.
Figure 4B:
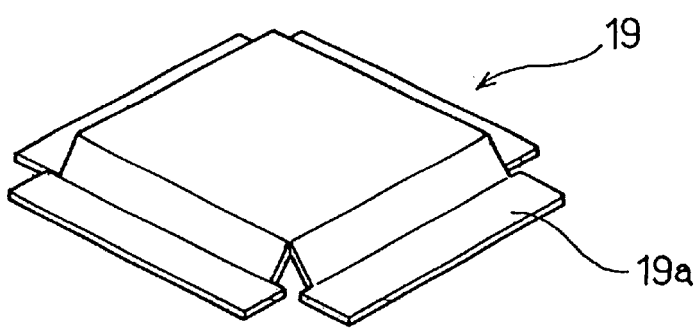
Figure 4C:
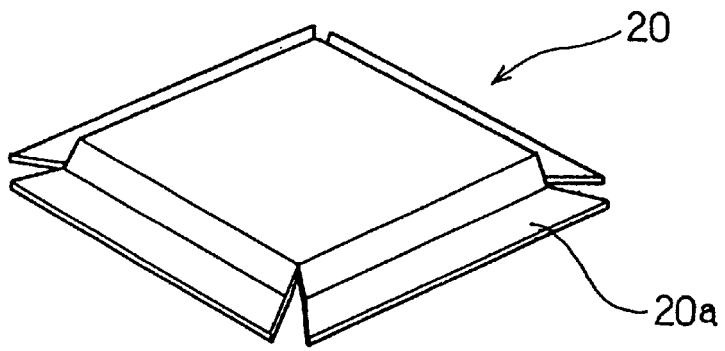

A first embodiment of the present invention will be described with reference to FIGS. 1A to 3. Referring to FIGS. 1A to 2, a ball grid array (BGA) type package 11 for the semiconductor device embodying the present invention is shown. The BGA type package 11 comprises a rectangular BGA substrate 12 made of a resin and provided with a number of solder ball terminals 13 arranged into the shape of a grid on the backside thereof. For example, the substrate 12 is about 20 mm square and about 1 mm thick. A number of pads are provided on an upper side of the substrate 12 for connection to bonding pads of a semiconductor chip 14. The pads are electrically connected via wiring patterns inside the substrate 12 to the solder ball terminals 13 on the backside of the substrate respectively. The semiconductor chip 14 is connected to the central upper side of the substrate 12 by flip-chip bonding. The semiconductor chip 14 may be square or rectangular when having a chip size not more than a 15 mm square, for example. A number of bumps (not shown) are provided on the surface (backside) of the semiconductor chip 14 connected to the wiring of electrode patterns inside the chip. The bumps are connected to the BGA substrate 12 by face-down bonding. A resin 15 fills a gap between the bumps and the substrate 12. In this state, a cover plate 16 is bonded to the upper side of the substrate 12 by an adhesive 17.

Referring to FIG. 2, the cover plate 16 includes a base or base 16a (23 mm square, for example) bonded to the upper surface of the semiconductor chip in contact with the latter, connecting portions 16 extending from four sides of the base 16a respectively and bonding portions 16c extending from the respective connecting portions 16b. As obvious from FIG. 2, the bonding portions 16c are disposed so as to be symmetrical about center lines of the cover plate 16 shown by chain lines. The cover plate 16 is formed by bending a metal plate, for example, a copper plate with a thickness of about 0.2 mm, by pressing so that the base 16a, the connecting portions 16b and the bonding portions 16c are formed integrally with one another. Each bonding portion 16c is bonded to the BGA substrate 12 and has a width of about 3 mm, for example.

An amount of bending (bending angle) of the connecting portions 16b is adjusted for adjustment of a gap between the cover plate 16 and the semiconductor chip 14 so that the cover plate 16 adheres closely via the adhesive to the semiconductor chip 14 when bonded to the substrate 12. Outside dimensions of the cover plate 16 are preferably set so that the bonding portions 16c do not reach the peripheral edge of the substrate 12, namely, so that the bonding portions 16c are located inside the peripheral edge of the substrate 12.

The BGA substrate 12 is heated up to a predetermined temperature, for example, about 150° C. The cover plate 16 is bonded to the substrate 12 under this condition in an assembly step. Stress is produced between the substrate 12 and the cover plate 16 in a cooling process. However, since the cover plate 16 is formed as described above, an amount of warp of the overall package due to the stress is reduced. More specifically, the cover plate 16 includes the four divided or discontinuous bonding portions 16c corresponding to the sides of the base 16a. The divided bonding portions 16c reduce the amount of warp of the overall package.

To confirm this effect, the inventor carried out simulations for the cover plate 16 as described above and another cover plate with an undivided or continuous bonding portion. The simulations will be described with reference to FIG. 3. First, the conditions of the simulations will be described. TABLE 1 shows model sizes representative of the dimensions of parts serving as input data. TABLE 2 shows material constants or the linear expansion coefficients α (ppm/° C.) and Young's modulus E (GPa) of the parts.

TABLE 1

| | Model size | |
|---|---|---|
| | Size (mm) | Thickness (mm) |
| BGA substrate | 40 × 40 | 1.0 |
| Semiconductor chip | 10 × 10 | 0.625 |
| Cover Base | 23 × 23 | 0.2 |
| plate Bonding portion | 2, 3 and 4 | |
| Adhesive agent | — | 0.10 |

TABLE 2

| | Material values | |
|---|---|---|
| | Linear expansion coefficient α (ppm/° C.) | Young's module E (GPa) |
| BGA substrate | 14.6 | 23.5 |
| Semiconductor chip | 3.5 | 170.0 |
| Supplied resin | 40.0 | 7.0 |

TABLE 2-continued

Material values

|  | Linear expansion coefficient α (ppm/° C.) | Young's module E (GPa) |
|---|---|---|
| Cover plate | | |
| Cu | 17.6 | 117.0 |
| SUS | 17.3 | 193.0 |
| Al | 24.3 | 68.6 |
| Adhesive agent | 114.0 | 0.9 |

FIG. 3 schematically shows a model used in the simulation or more specifically, one of four equally divided portions of the package. The following conditions are set as parameters for the simulation. First, simulations were carried out for cover plates made of stainless steel (SUS) and aluminum (Al) respectively as well as the cover plate made of copper (Cu) for confirmation of material dependency of the cover plate 16. Second, the linear expansion coefficient was set at three different values and simulations were carried out for confirmation of the dependency on the linear expansion coefficient which was considered an important factor as the material value of the material of the cover plate 16. Third, the width of each bonding portion 16c of the cover plate 16 was set at three different values, 2 mm, 3 mm, and 4 mm and simulations were carried out for confirmation of the dependency on the width of each bonding portion 16c.

Simulating conditions were set in view of actual ones in the assembly. A temperature in an initial state was set at 150° C. equal to the temperature in the assembly. It was assumed that each part was subjected to no stress in this state. The cover plate 16 was bonded to the BGA substrate 12 under this temperature condition. Thereafter, the stress to which each part of the cover plate was subjected was calculated when the temperature was decreased to 25° C. At that time, an amount of deformation of the overall cover plate 16 was obtained as an amount of warp d as shown in FIG. 3. In FIG. 3, reference point 0 designates the center position of the semiconductor chip 14. An amount d of warp is an amount of vertical displacement at a corner of the substrate 12 due to deformation.

The material dependency of the cover plate 16 was calculated as the first simulation for obtaining grounds for the use of copper as the material of the cover plate 16. Stainless steel and aluminum were selected as materials to be compared with copper. TABLE 1 shows material coefficients of these materials.

As the result of the first simulation, the cover plate made of copper revealed a smallest warp amount d (d=0.063 mm) and achieved desired characteristics. The warp amount d was 0.064 mm in the case of the cover plate made of stainless steel. However, the warp amount d was 0.197 mm in the case of the cover plate made of aluminum. Consequently, aluminum found difficult to be used as the material of the cover plate from the point of view of the warp amount d. Actually, however, the material should not be selected on the basis of only the above-described results of simulation since a heat radiating characteristic is a determining factor in addition to the warp amount d.

The dependency on the linear expansion coefficient α was calculated as the second simulation. The linear expansion coefficient α was considered to affect selection of the material as a factor of the above-described material dependency. Differing from the first simulation, the second simulation was carried out to confirm the dependency only on the linear expansion coefficient α. Accordingly, the materials were assumed to have the same Young's module as that of the copper (117). The values of the linear expansion coefficient α used in the simulation were set at a minimum value or the value of the substrate 12, 14.6 ppm/° C. In view of the applied metals, the linear expansion coefficient was further set at values larger than 14.6 ppm/° C., that is, 17.7 ppm/° C.

As the result of the second simulation, the warp amount d was found to increase with increases in the linear expansion coefficient α. Furthermore, the value of the linear expansion coefficient α determining a practically allowed range of warp amount d was found to be about 20 ppm/° C. Actually, however, the Young's module as an important condition regarding the stress is another factor determining the material of the cover plate 16 as well as the linear expansion coefficient α. Therefore, the Young's module should be taken into consideration in determination of the material.

The dependency on the width of each bonding portion 16c of the cover plate 16 was calculated as the third simulation. In view of the practical range, simulations were carried out for the cover plates including the bonding portions having three different widths, 2 mm, 3 mm and 4 mm, respectively, as shown in TABLE 2.

In the range between 2 to 4 mm, the warp amount d became smaller as the width of each bonding portion 16c is reduced. This tendency shows that the warp amount d is further reduced when the width of each bonding portion 16c is at or below 2 mm. Actually, however, the width of each bonding portion 16c should not be determined on the basis of only the warp amount d. For example, other factors to be taken into account include bond strength between each bonding portion 16c and the substrate, and operating characteristics of the cover plate 16 depending upon the width of each bonding portion 16c. The width of each bonding portion 16c is effectively set at about 3 mm with a margin being included, as described above in the embodiment.

According to the foregoing embodiment, the substrate 12 of the BGA package is made of the resin. The cover plate 16 is provided for covering the semiconductor chip 14 and for enhancing heat radiation from the chip. The cover plate 16 is provided with four divided bonding portions 16c. Consequently, the warp amount d of the substrate 12 can be reduced in the step of bonding the cover plate 16 as compared with the construction in which the cover plate includes a continuous bonding portion, and accordingly, a practically effective cover plate can be obtained.

The cover plate 16 is made of copper in the foregoing embodiment. Consequently, the warp amount d of the substrate 12 can further be reduced as compared with the case where the cover plate is made of a material with a high linear expansion coefficient α, for example, aluminum. Furthermore, since the width of each bonding portion 16c is set at about 3 mm, the warp amount d can further be reduced with a sufficient bond strength being ensured.

FIGS. 4A to 7B illustrate modified forms of the cover plate 16. First, cover plates shown in FIGS. 4A to 4C include different shapes of the bonding portions 16c respectively. In the cover plate 18 shown in FIG. 4A, one of two pairs of opposite bonding portions 18a and 18b has a length larger than the other pair, so that a bonding area is increased. FIG. 4B shows a cover plate 19 including four bonding portions 19a each of which has an increased length by extending both ends thereof. In the cover plate 20 shown in FIG. 4C, each bonding portion 20a is formed into a trapezoidal shape so that a bonding area thereof is increased. In the modified forms of FIGS. 4A to 4C, too, the warp amount d can be reduced with improvements in the bonding strength and heat radiation as in the foregoing embodiment.

Figure 5A:
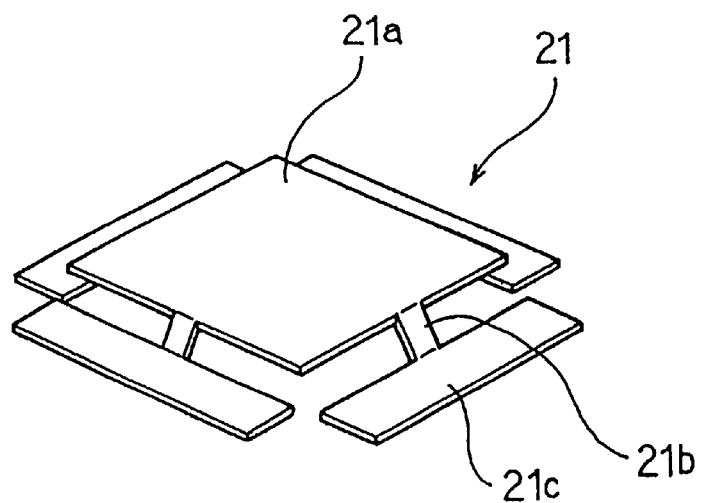
FIGS. 5A and 5B are perspective views of other modified cover plates respectively.
Figure 5B:
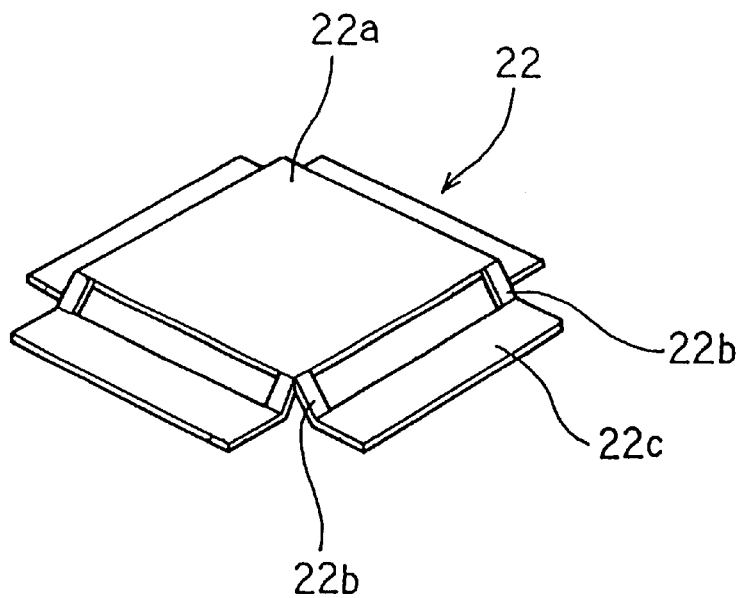

FIGS. 5A and 5B illustrate cover plates having different connecting portions respectively. In the cover plate 21 shown in FIG. 5A, a single narrow connecting portion 21b connects between the base 21a and each bonding portion 21c. The connecting portion 21b has a width W smaller than a length L of the corresponding bonding portion 21c. In the cover plate 22 shown in FIG. 5B, two narrow connecting portions 22b connect between the base 22a and each bonding portion 22c. Both constructions can achieve a further reduction in the warp amount d as compared with the foregoing embodiment. Three or more connecting portions 21b or 22b may be provided on each side of the base. Furthermore, the locations of the connecting portions may be changed.

Figure 6A:
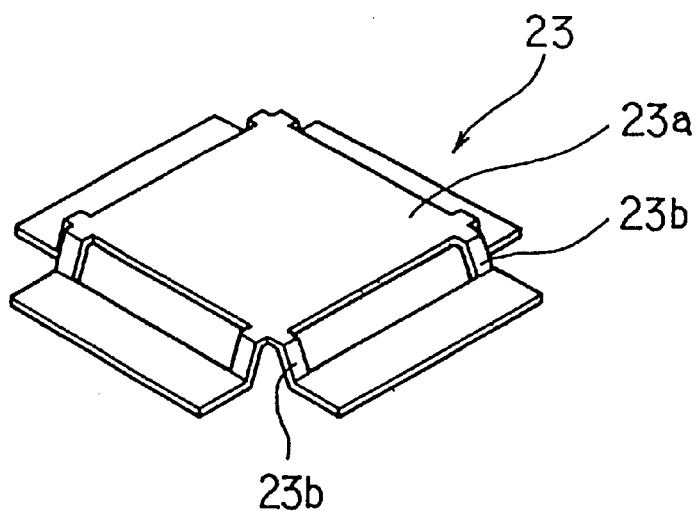
FIGS. 6A and 6B are perspective views of further other modified cover plates respectively.
Figure 6B:
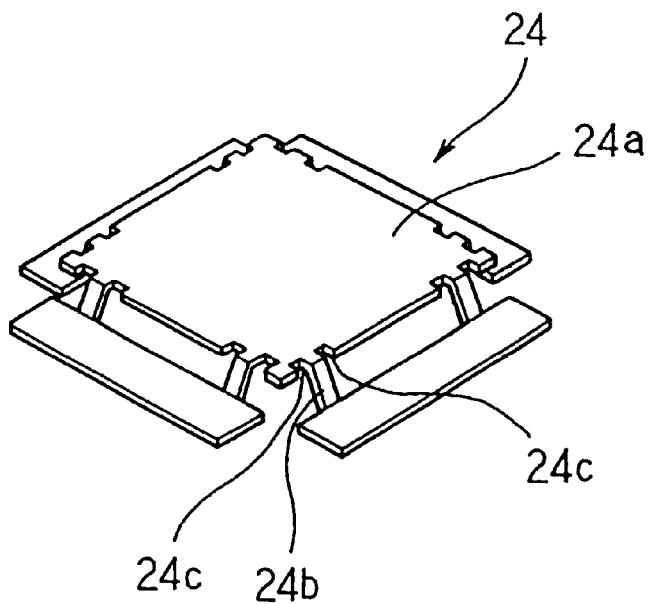

FIGS. 6A and 6B illustrate cover plates 23 and 24 each of which is a modified form of the cover plate 22 of FIG. 5B. In each of the cover plates shown in FIGS. 6A and 6B, each connecting portion is bent without strain for improvement in the workability and flow stress is reduced with respect to the base. In the cover plate 23 shown in FIG. 6A, each connecting portion 23b extending from the base 23a is bent not at a root thereof but en route. In the cover plate 24 shown in FIG. 6B, each connecting portion 24b has two notches 24c formed in opposite sides of a root thereof respectively. The same effect can be achieved from each construction as from the foregoing embodiment.

Figure 7A:
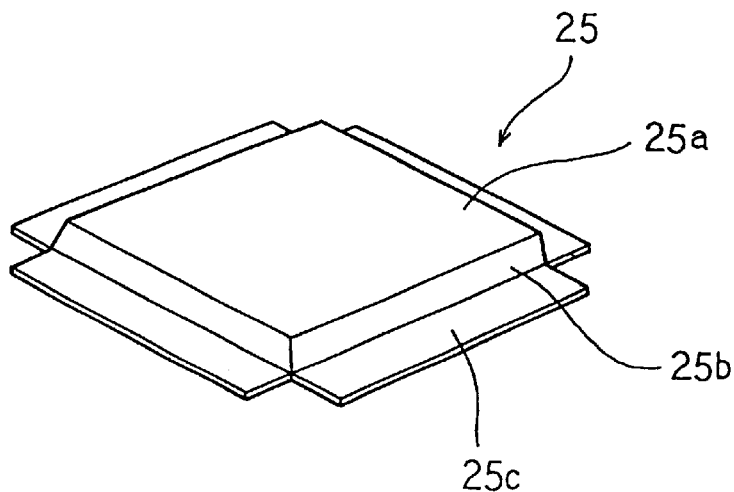
FIGS. 7A and 7B are perspective views of still further other modified cover plates respectively.
Figure 7B:
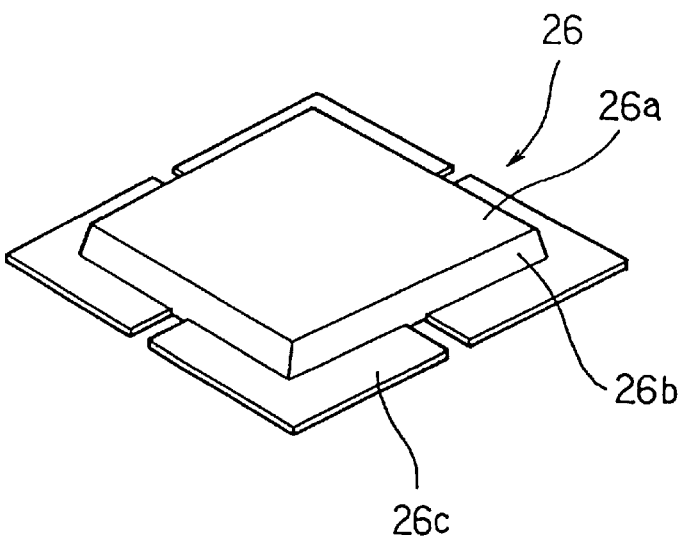

FIGS. 7A and 7B illustrate cover plates 25 and 26 in each of which the base 16a and the connecting portions 16b are formed into the shape of a container by drawing. In the cover plate shown in FIG. 7A, four divided bonding portions 25c are formed to correspond to the sides of the connecting portions 25b respectively. In the cover plate 26 shown in FIG. 7B, bonding portions 26c are divided in the middle portions of the sides of the connecting portions 26b. The same effect can be achieved from each construction as from the foregoing embodiment.

Figure 10:
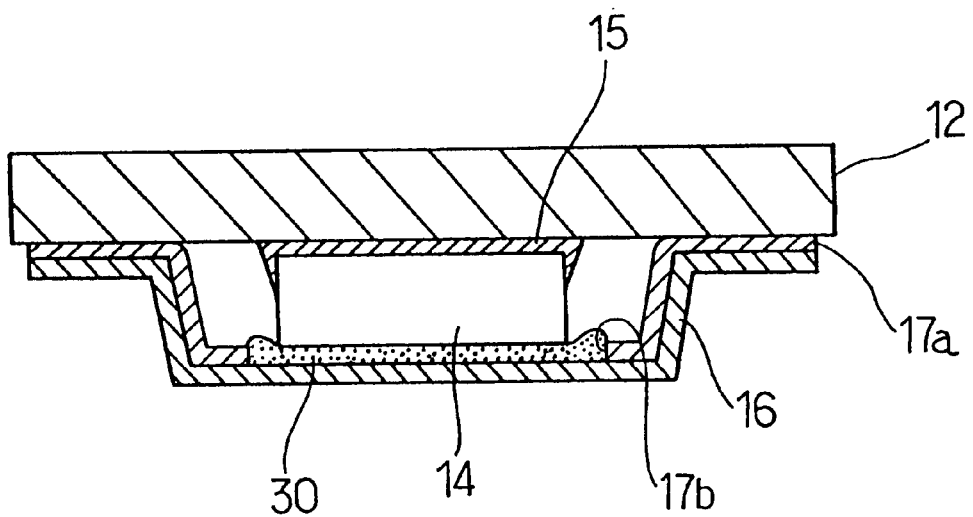
FIG. 10 is a view similar to FIG. 9, showing a modified cover plate.

FIGS. 8 to 10 illustrate a second embodiment of the invention. Differences between the first and second embodiments will be described. Referring to FIG. 8, a cover plate 27 is shown which includes a base 27a, connecting portions 27b and bonding portions 27c as the cover plate 16 in the first embodiment. The cover plate 27 has a weir or barrier 28 formed by pressing on the inside of the base 27a so that a portion of the base opposed to the semiconductor chip 14 is surrounded by the barrier. When a paste 30 is applied to a region 29 surrounded by the barrier 28, the barrier prevents the paste 30 from flowing outside. The paste 30 with high heat conductivity is applied between the cover plate 27 and the semiconductor chip 14 as shown in FIG. 9, so that heat produced by the semiconductor chip 14 is effectively dissipated through the paste 30 to the cover plate 27 side.

The paste 30 is previously applied to the region 29 of the cover plate 27. The substrate 12 with the semiconductor chip 14 bonded thereto is then bonded to the cover plate 27. Since the barrier 28 is formed on the cover plate 27, a necessary amount of paste 30 can economically be applied to the region 29. Even when the used paste 30 has a low viscosity, the barrier 28 prevents the paste 30 from spreading outside. This prevents the paste 30 from flowing through slits or spaces between the connecting portions 27b and improves the assembling efficiency.

Figure 11:
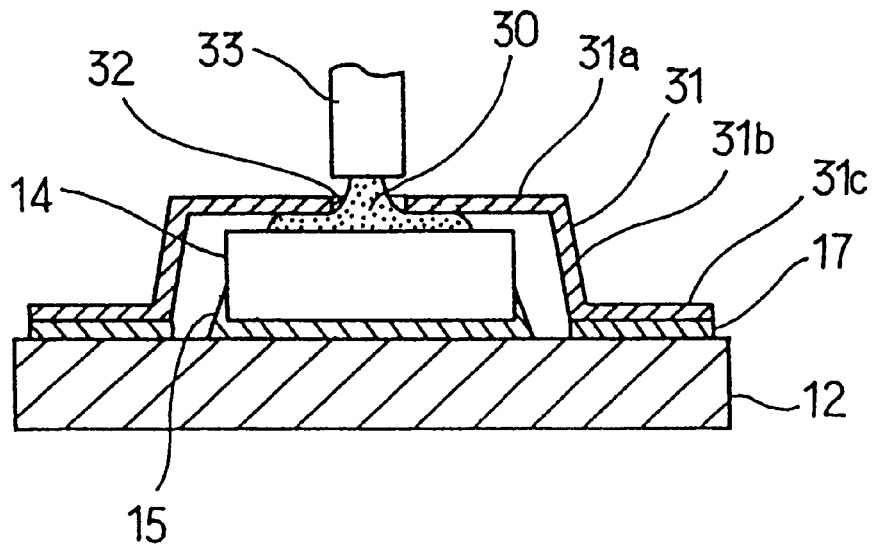
FIG. 11 is a longitudinal side section of the BGA package of a third embodiment in accordance with the invention, showing a fabrication step.
Figure 12:
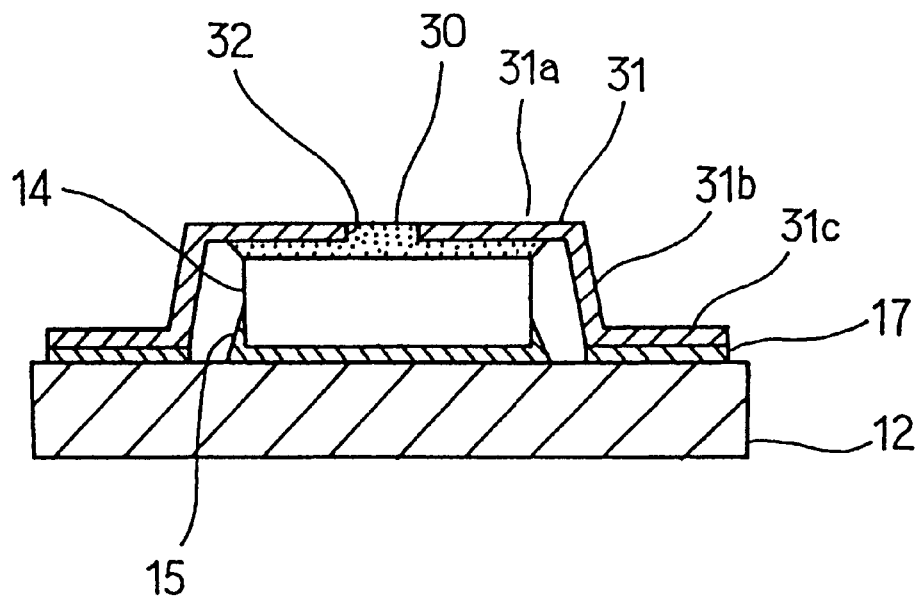
FIG. 12 is a view similar to FIG. 1A.
Figure 13:
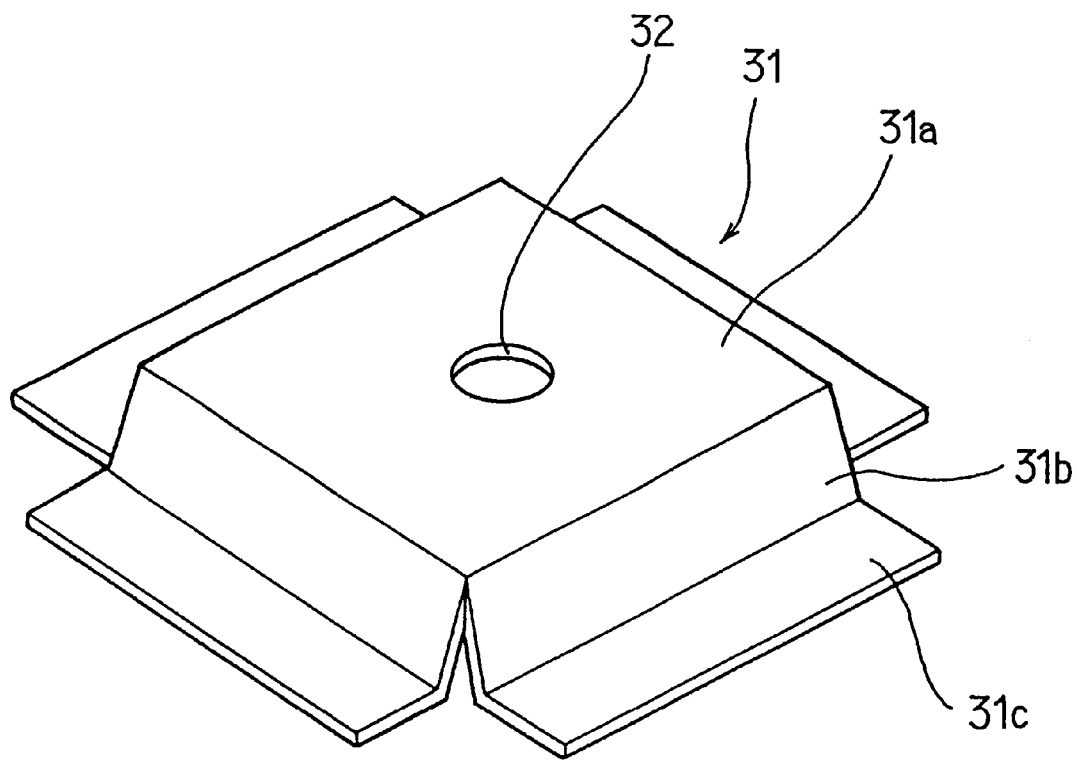
FIG. 13 is a perspective view of the cover plate used in the third embodiment.
Figure 14:
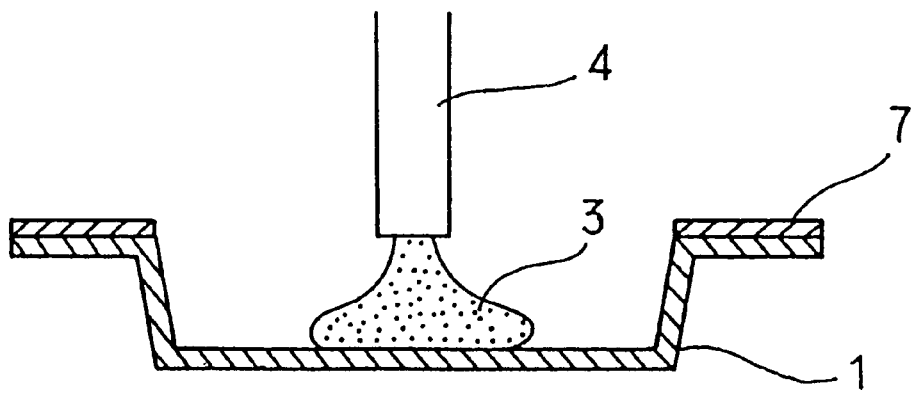
FIG. 14 is a longitudinal side section of a conventional cover plate, showing a fabrication step.
Figure 15:
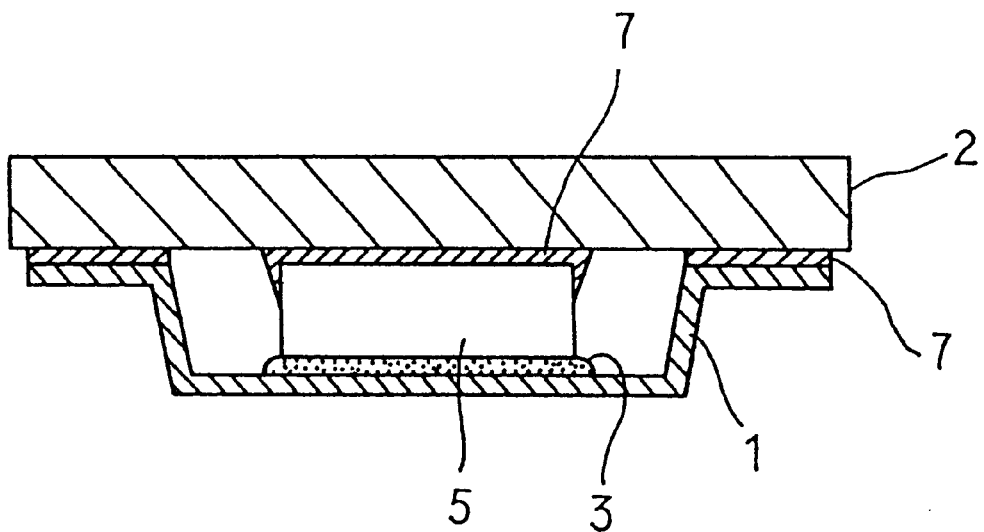
FIG. 15 is a view similar to FIG. 1, showing the conventional package.

FIG. 10 illustrates a modified form of the barrier. The cover plate 16 same as in the first embodiment is used. An adhesive sheet 17a is applied to a bonded face side of the cover plate 16 at which side the cover plate is bonded to the substrate 12. A portion of the adhesive sheet 17a corresponding to the region where the paste 30 is applied is eliminated, whereby a paste accommodating portion is defined. An opening resulting from the elimination of the adhesive sheet 17a provides a stepped portion equal to the thickness of the adhesive sheet. The stepped portion of the opening serves as a barrier 17b. Consequently, a precisely pressed portion as required in the provision of the barrier 28 is not necessitated. FIGS. 11 to 13 illustrate a third embodiment of the invention. Differences between the first and third embodiments will be described. Referring to FIG. 13, a cover plate 31 includes a base 31a, connecting portions 31b and bonding portions 31c as the cover plate 16 in the first embodiment. The base 31a has a centrally formed circular injection opening 32 corresponding to the semiconductor chip 14. The paste 30 with high heat conductivity is applied between the semiconductor chip 14 and the cover plate 31. In this regard, the cover plate 31 is bonded to the BGA substrate 12 and thereafter, the paste 30 is injected through the opening 32 inside the cover plate 31. Thus, in the third embodiment, the paste 30 is injected by a dispenser 33 through the opening 32 inside the cover plate 31 at the upper face side of the cover plate 31 after the cover plate has been bonded to the semiconductor chip 14, as shown in FIGS. 11 and 12. As a result, a necessary amount of paste 30 can be injected as shown in FIG. 12.

According to the third embodiment, the paste 30 is applied with the cover plate 31 bonded to the semiconductor chip 14 without using specific equipment. This can eliminate the step of previously applying the paste 30 inside the cover plate 31. Consequently, the working efficiency in the assembly can be improved and the assembling procedure can be simplified.

In modifications, five or more bonding portions may be formed. For example, the side of each bonding portion may be divided into two or more portions or three or more portions so that eight or twelve divided bonding portions are formed.

The barrier 28 formed on the cover plate 27 in the second embodiment and the injection opening 32 formed in the cover plate 31 in the third embodiment should not be limited to the cover plates 27 and 31 with the four divided bonding portions 27a and 31c respectively. The barrier 28 and the injection opening 32 may be provided on and in a non-divided cover plate. The barrier 28 and the injection opening 32 may be formed on and in each of the cover plates 18 to 27 described above as the modified forms of the first invention.

The foregoing description and drawings are merely illustrative of the principles of the present invention and are not to be construed in a limiting sense. Various changes and modifications will become apparent to those of ordinary skill in the art. All such changes and modifications are seen to fall within the scope of the present invention as defined by the appended claims.

We claim:

1. A semiconductor device comprising:
    a substrate made of a resin and having a first side on which a number of solder ball terminals are provided and a second side on which a chip mounting portion electrically connected the terminals provided; and
    a cover plate made of a metal and bonded to a semiconductor chip so as to cover the same under a condition where the semiconductor chip is connected to the resin substrate by a flip-chip process, the cover plate comprising:
- a base brought into contact with the semiconductor chip;
- a plurality of connecting portions having a first end and a second end, the connecting portions each being coupled to the base along the first end; and
- a plurality of bonding portions each coupled to the second end of at least one of the connecting portions and discontinuous with each other for bonding the cover plate to the substrate.

2. A semiconductor device according to claim 1, wherein the bonding portions are arranged into an axial symmetry.

3. A semiconductor device according to claim 2, wherein the cover plate is made of a metal having a linear expansion coefficient equal to or larger than one of the resin substrate and equal to or smaller than 20 ppm/° C.

4. A semiconductor device according to claim 2, wherein each bonding portion has such a minimum width that a predetermined bonding strength is ensured between the resin substrate and each bonding portion.

5. A semiconductor device according to claim 1, wherein the cover plate is formed as a bent metal plate, such that the base, bonding portions and connecting portion are formed integrally with one another.

6. A semiconductor device according to claim 5, wherein the connecting portion is divided into a plurality of portions connecting the respective bonding portions to the base.

7. A semiconductor device according to claim 6, wherein each divided portion of the connecting portion has a width smaller than a length of the corresponding bonding portion.

8. A semiconductor device according to claim 7, wherein the cover plate is made of a metal having a linear expansion coefficient equal to or larger than one of the resin substrate and equal to or smaller than 20 ppm/° C.

9. A semiconductor device according to claim 7, wherein each bonding portion has such a minimum width that a predetermined bonding strength is ensured between the resin substrate and each bonding portion.

10. A semiconductor device according to claim 6, wherein the cover plate is made of a metal having a linear expansion coefficient equal to or larger than one of the resin substrate and equal to or smaller than 20 ppm/° C.

11. A semiconductor device according to claim 6, wherein each bonding portion has such a minimum width that a predetermined bonding strength is ensured between the resin substrate and each bonding portion.

12. A semiconductor device according to claim 5, wherein the connecting portion of the cover plate is formed continuously so as to surround the base.

13. A semiconductor device according to claim 12, wherein the cover plate is made of a metal having a linear expansion coefficient equal to or larger than one of the resin substrate and equal to or smaller than 20 ppm/° C.

14. A semiconductor device according to claim 12, wherein each bonding portion has such a minimum width that a predetermined bonding strength is ensured between the resin substrate and each bonding portion.

15. A semiconductor device according to claim 5, wherein the cover plate is made of a metal having a linear expansion coefficient equal to or larger than one of the resin substrate and equal to or smaller than 20 ppm/° C.

16. A semiconductor device according to claim 5, wherein each bonding portion has such a minimum width that a predetermined bonding strength is ensured between the resin substrate and each bonding portion.

17. A semiconductor device according to claim 1, wherein the cover plate is made of a metal having a linear expansion coefficient equal to or larger than one of the resin substrate and equal to or smaller than 20 ppm/° C.

18. A semiconductor device according to claim 17, wherein the cover plate is made of copper or stainless steel.

19. A semiconductor device according to claim 18, wherein each bonding portion has such a minimum width that a predetermined bonding strength is ensured between the resin substrate and each bonding portion.

20. A semiconductor device according to claim 17, wherein each bonding portion has such a minimum width that a predetermined bonding strength is ensured between the resin substrate and each bonding portion.

21. A semiconductor device according to claim 1, wherein each bonding portion has such a minimum width that a predetermined bonding strength is ensured between the resin substrate and each bonding portion.

22. A semiconductor device according to claim 21, wherein the width of each bonding portion of the cover plate ranges between 2 mm and 4 mm.

23. A semiconductor device comprising:
- a substrate made of a resin and having a first side on which a number of solder ball terminals are provided and a second side on which a chip mounting portion electrically connected to the solder ball terminals is provided; and
- a cover plate made of a metal and bonded to a semiconductor chip so as to cover the same under a condition where the semiconductor chip is connected to the resin substrate by a flip-chip process, the cover plate comprising:
  - a base brought into contact with the semiconductor chip through a paste, the base including a barrier preventing the paste from overflowing a portion thereof corresponding to a location of the semiconductor chip, the paste increasing heat conductivity and being provided between the semiconductor chip and the cover plate when the chip is mounted on the substrate;
  - a plurality of connecting portions having a first end and a second end, the connecting portions each being coupled to the base along the first end; and
  - a plurality of bonding portions each coupled to the second end of at least one of the connecting portions and discontinuous with each other for bonding the cover plate to the substrate.

24. A semiconductor device according to claim 23, wherein the barrier is formed integrally with the cover plate.

25. A semiconductor device according to claim 23, wherein the cover plate has a face bonded to the substrate and an adhesive sheet is applied to substantially the overall face except a portion thereof brought into contact with the semiconductor chip, whereby the barrier is formed.

26. A semiconductor device comprising:
- a substrate made of a resin and having a first side on which a number of solder ball terminal are provided and a second side on which a chip mounting portion electrically connected to the solder ball terminals is provided; and
- a cover plate made of a metal and bonded to a semiconductor chip so as to cover the same under a condition where the semiconductor chip is connected to the resin substrate by a flip-chip process, the cover plate having an injection opening through which a paste for improvement in heat conductivity is supplied into an area of a space defined between the cover plate and the resin substrate when the cover plate is attached to the resin substrate, the area corresponding to a location of the semiconductor chip, the cover plate comprising:

a base brought into contact with the semiconductor chip;

a plurality of connecting portions having a first end and a second end, the connecting portions each being coupled to the base along the first end; and a plurality of bonding portions each coupled to the second end of at least one of the connecting portions and discontinuous with each other for bonding the cover plate to the substrate.

* * * * *

UNITED STATES PATENT AND TRADEMARK OFFICE
CERTIFICATE OF CORRECTION

PATENT NO.     : 6,376,907 B1
DATED          : April 23, 2002
INVENTOR(S)    : Takano et al.

It is certified that error appears in the above-identified patent and that said Letters Patent is hereby corrected as shown below:

Column 10,
Line 65, change "connected the terminals" to -- connected to the solder ball terminals is --.

Column 12,
Line 62, change "terminal are" to -- terminals are --.

Signed and Sealed this

Twenty-fifth Day of February, 2003

JAMES E. ROGAN
*Director of the United States Patent and Trademark Office*